United States Patent [19]

Swaminathan

[11] Patent Number: 5,195,137
[45] Date of Patent: Mar. 16, 1993

[54] METHOD OF AND APPARATUS FOR GENERATING AUXILIARY INFORMATION FOR EXPEDITING SPARSE CODEBOOK SEARCH

[75] Inventor: Kumar Swaminathan, Mine Hill, N.J.

[73] Assignee: AT&T Bell Laboratories, Murray Hill, N.J.

[21] Appl. No.: 646,122

[22] Filed: Jan. 28, 1991

[51] Int. Cl.$^5$ ............................................. G10L 5/00
[52] U.S. Cl. ....................................... 381/32; 381/29
[58] Field of Search ................... 381/43, 32, 31, 29, 381/35

[56] References Cited

U.S. PATENT DOCUMENTS

| | | | |
|---|---|---|---|
| 4,797,925 | 1/1989 | Lin | 381/36 |
| 4,817,157 | 3/1989 | Gerson | 381/40 |
| 4,963,030 | 10/1990 | Makur | 381/31 X |
| 5,038,377 | 8/1991 | Kihara et al. | 381/35 X |

OTHER PUBLICATIONS

G. Davidson and Allen Gersho, "Complexity Reduction Methods for Vector Excitation Coding," IEEE ICASSP 86, Tokyo (1986), pp. 3055–3058.
W. B. Kleijn, D. J. Krasinski and R. H. Ketchum, "Improved Speech Quality and Efficient Vector Quantization in SELP," IEEE (1988), pp. 155–158.

Primary Examiner—Emanuel S. Kemeny
Assistant Examiner—S. A. Melnick
Attorney, Agent, or Firm—A. G. Steinmetz

[57] ABSTRACT

In many applications involving the coding and processing of speech signals the relevant applicable codebook is one which may be termed a sparse codebook. That is, the majority of elements in the codebook are zero valued. The searching of such a sparse codebook is accelerated in accord with the present invention by generating auxiliary information defining the sparse nature of the codebook and using this information to assist and speed up searches of the codebook.

In a particular method of searching the calculation of the distance between a target vector and a stored codebook vector is enhanced by use of a distortion metric derived from energy terms and correlation terms of the codebook entries. Calculation of these energy and correlation terms is speeded up by exploiting the sparseness of the codebook entries. The non-zero elements (NZE) of the space codebook are each identified and are defined by their offset from a reference point.

13 Claims, 12 Drawing Sheets

METHOD OF AND APPARATUS FOR GENERATING AUXILIARY INFORMATION FOR EXPEDITING SPARSE CODEBOOK SEARCH

FIELD OF THE INVENTION

This invention relates to codebook searching techniques and in particular to searching codebooks stored in memory which are used for speech processing in telephone communication systems.

BACKGROUND OF THE INVENTION

Digital transmission is becoming important in the processing of speech for telephone communication systems including digital radiotelephone systems. Analog speech signals are converted into digital data for transmission and reconstructed into analog speech at the termination end of the transmission. Digital speech processing has many offsetting requirements in which speech quality must be offset against available memory, processing speed and bandwidth requirements.

Because of growing demand and the conversion to digital transmission, the required bandwidth for a telephone transmission channel has increased significantly. This has lead to the development of digital data processing techniques to reduce the bandwidth required for a particular level of subscriber capacity for a telephone transmission channel.

Increasing the number of channels for a particular bandwidth has been achieved by application of techniques to reduce the required bit rate to accommodate a given capacity. These techniques include many data compression schemes for reducing the number of bits required to specify a particular analog signal. For example straight forward conversion of an analog speech signal to digital from would require a very large bandwidth for transmission probably making such transmission uneconomical. By compressing the digital data, the required transmission bandwidth can be significantly reduced.

Many various coding techniques have been devised to achieve the desired data compression to reduce the required bandwidth for transmission. Many of these techniques require the conversion of a digitally encoded signal to some preset quantized signal. Such a signal is derived by comparing an initially digitized signal with a limited set of preselected digitally encoded levels contained in a memory designated codebook. The initially digitized signal is compared with each codebook entry and the codebook entry best representing the initially digitized signal is selected for transmission or for further processing prior to a subsequent transmission.

A search for a matching stored code using an element by element comparison is time consuming if the codebook is large and is hence unsuitable for speech transmission systems that operate in real time. The use of small easily search codebooks are unacceptable because it fails to provide enough information to accurately reproduce the original analog signal. Many alternative codebook search techniques have been developed to speed up the process and permit searches in the real operating time of the speech processing system. Many of these techniques take advantage of known properties of speech signals and known properties of digital codes. These techniques have included the prior techniques of carefully preselecting the codebook entries in light of the expected characteristics of the speech signal to enhance the subsequent searching processes and various distortion measuring techniques for measuring expected distortions between the actual and coded signal.

SUMMARY OF THE INVENTION

In many applications involving the coding and processing of speech signals the relevant applicable codebook is one which may be termed a sparse codebook. That is, the majority of elements in the codebook are zero valued. The searching of such a sparse codebook is accelerated in accord with the present invention by generating auxiliary information defining the sparse nature of the codebook and using this information to assist and speed up searches of the codebook.

In a particular method of searching the calculation of the distance between a target vector and a stored codebook vector is enhanced by use of a distortion metric derived from energy terms and correlation terms of the codebook entries. Calculation of these energy and correlation terms is speeded up according to the principal of the invention by exploiting the sparseness of the codebook entries. The non-zero elements (NZE) of the sparse codebook are each identified and are defined by their offset from a reference point. These items are utilized to speed up the codebook search.

In speech coding, applications employing low bit rate CELP codecs, the codebooks are typically sparse and overlapping and use a symmetric Toeplitz spectral weighting matrix for the calculation of the distortion term for each codebook vector. Auxiliary information for assisting these calculations can be significantly enhanced by taking advantage of these added existing conditions.

DETAILED DESCRIPTION

Figure 1:
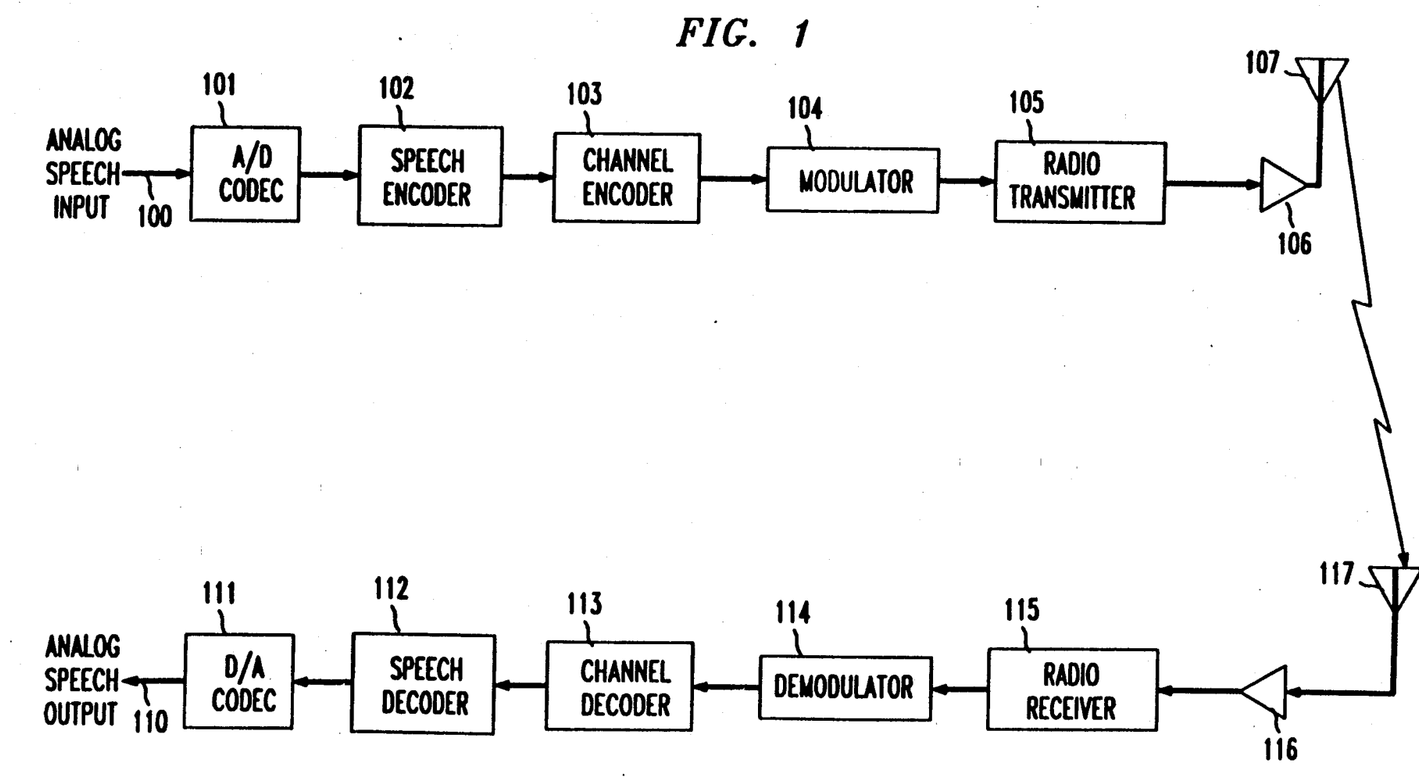
FIG. 1 is a block diagram of speech transmission and reception circuitry for a transceiver unit in a mobile digital radiotelephone system.

A typical radio transmitter and receiver used in cellular radio communication and having speech coding and decoding apparatus is shown in FIG. 1. In the transmission portion analog speech is applied to the analog-to-digital codec 101, via input terminal 100. The digitized speech is encoded in the speech encoder 102 and applied to the channel encoder 103. The signal is modulated in modulator 104 and applied to the radio transmitter 105 which applies an RF signal to amplifier 106. The output of amplifier 106 is coupled to antenna 107 for radio transmission.

Antenna 117 receives transmitted radio signals and applies them through the amplifier 116 to a radio receiver 115. This radio signal is demodulated in the demodulator 114 and is channel decoded in the channel decoder 113. The speech signal is decoded in the speech decoder 112 and converted to an analog speech signal in the digital-to-analog codec 111. The analog speech signal is supplied on the output terminal 110.

Figure 2:
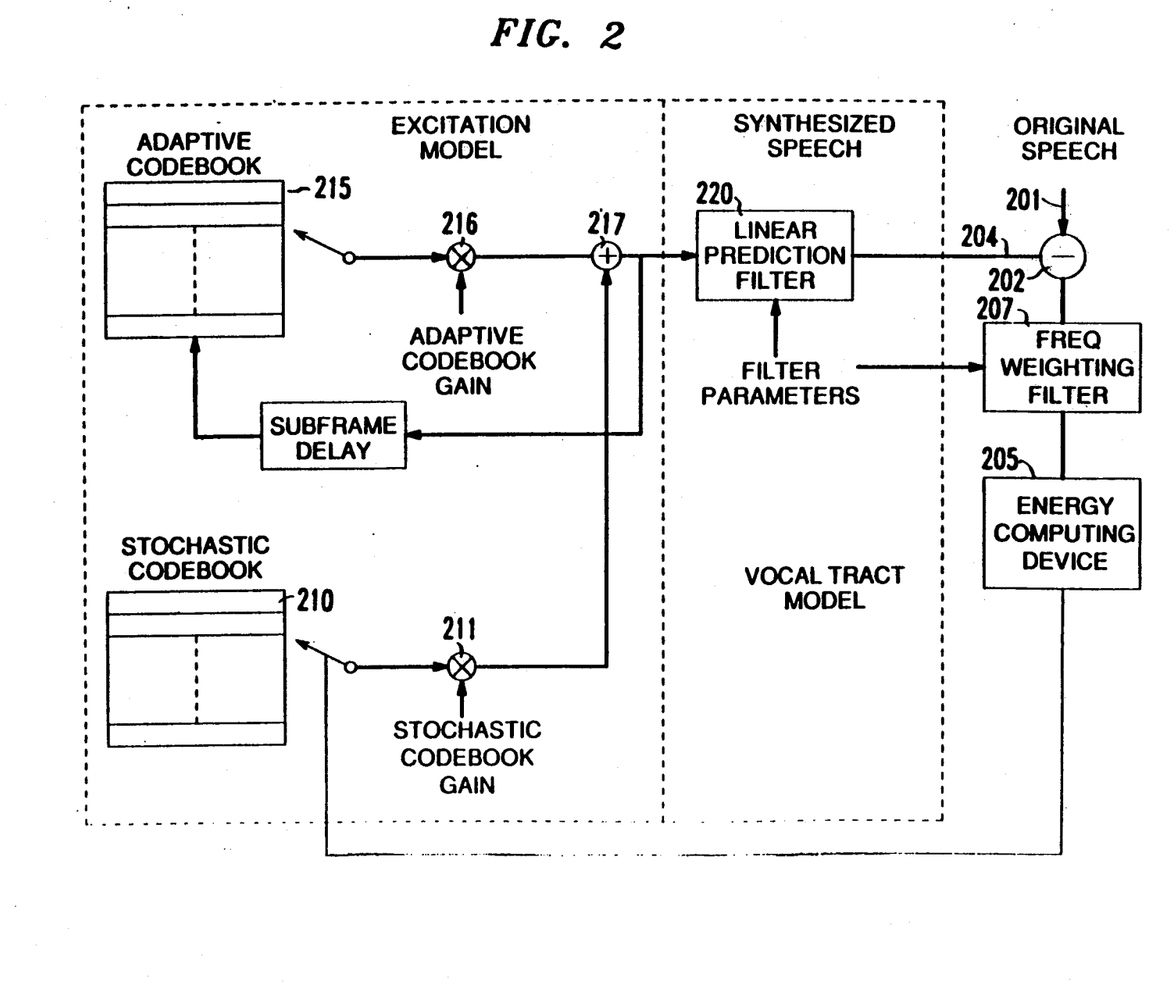
FIG. 2 is a schematic of a speech processing module for a mobile digital radiotelephone communication system.

A block diagram of a speech coding apparatus, suitable for use as a speech coder in a digital radio telecommunications systems, is disclosed in FIG. 2. This speech coding apparatus is a code excited linear predictive (CELP) speech coder in which incoming analog speech signal samples are converted into a digital vector form. CELP coding provides good speech quality at low bit rates. The digital vector of the incoming speech sample is compared with a set of vectors stored in a codebook or digital memory device. The stored vector closest in value to the digital vector of the speech sample is selected and an index number (an address) associated with the stored vector is the signal transmitted. The index number is used to select a stored vector in a codebook at a receiver from which the original speech signal is to be reconstructed.

In the apparatus of FIG. 2 the incoming speech signal is applied, via the input lead 201, to a summing circuit 202 which determines a difference between a synthesized speech signal on lead 204 and the incoming speech signal on lead 201. The resulting difference signal is applied to a frequency or spectral weighting filter 207 which is operative in response to filter parameters applied thereto as an input to generate a weighted spectrum error signal which represents an adjusted difference between the input speech and the synthesized speech signal.

The power in the spectrum error signal is measured in the energy computing device 205 whose energy signal output is used for searching a stochastic codebook 210 so that signal energy is maintained at a minimum. The stochastic codebook is normally populated by random vectors representing representative quantized entries. A high proportion of its stored vector elements are typically zero entries ($> \frac{2}{3}$ of the element entries) and hence codebook 210 is a sparse codebook.

An adaptive codebook 215 contains overlapping updated vector entries representing the speech already processed and is continuously updated in each of the subframes of operation. Its output is modified by a gain signal applied, via multiplier 216, and this signal with gain is summed in summing circuit 217 with the output of the stochastic codebook 210 which is modified by gain applied, via multiplier 211.

Figure 3:
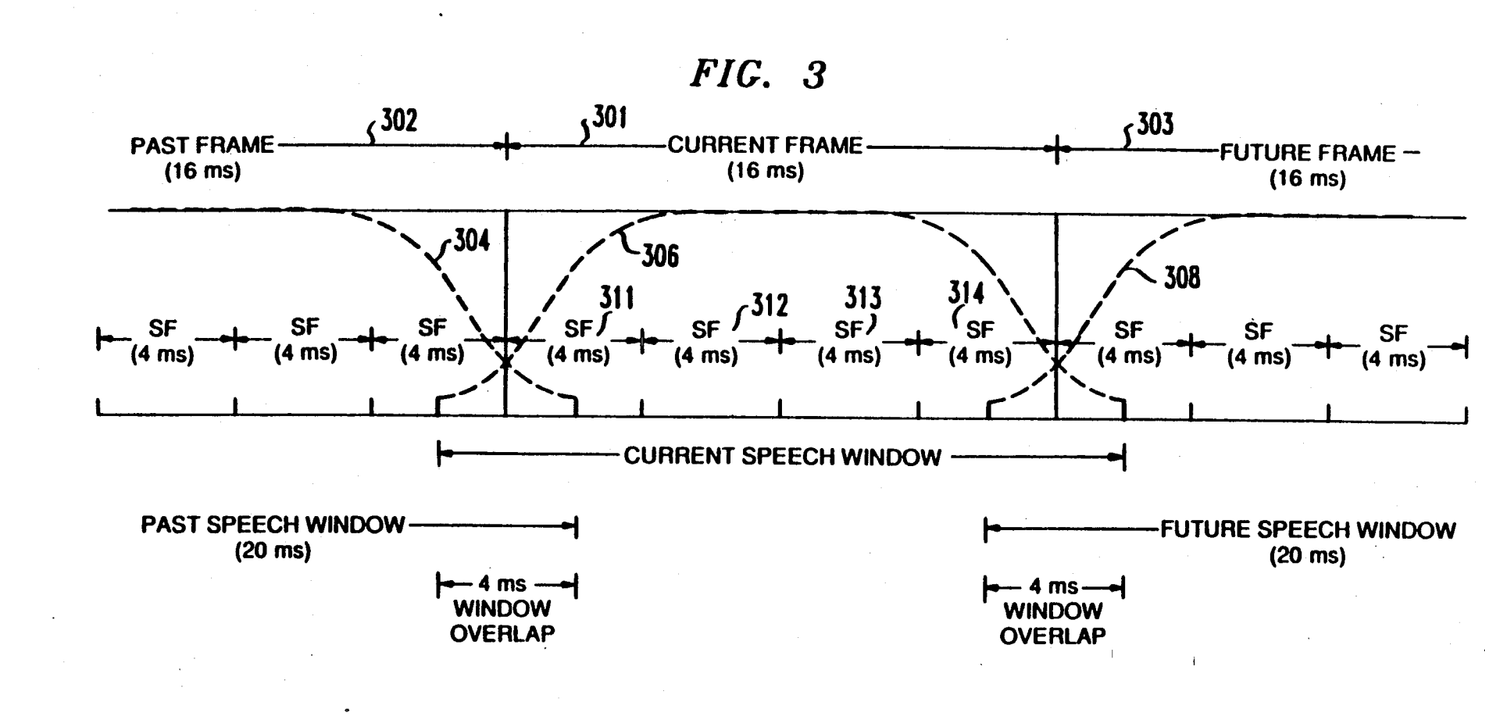
FIG. 3 is a waveform showing how the speech encoding is applied to coded frames of speech signals.

The nature of speech processing is such that the speech is encoded by considering successive finite intervals of the speech signal. These finite intervals are designated as frames 301, 302 and 303. Processing occurs within a speech window, as shown by the window encompassing waveform 306 in FIG. 3. The speech signal within each frame, such as frame 301, is divided into subframes 311–314 in order to facilitate the encoding of the speech signal. The window continuously advances introducing new entries into the leading subframes.

Figure 4:
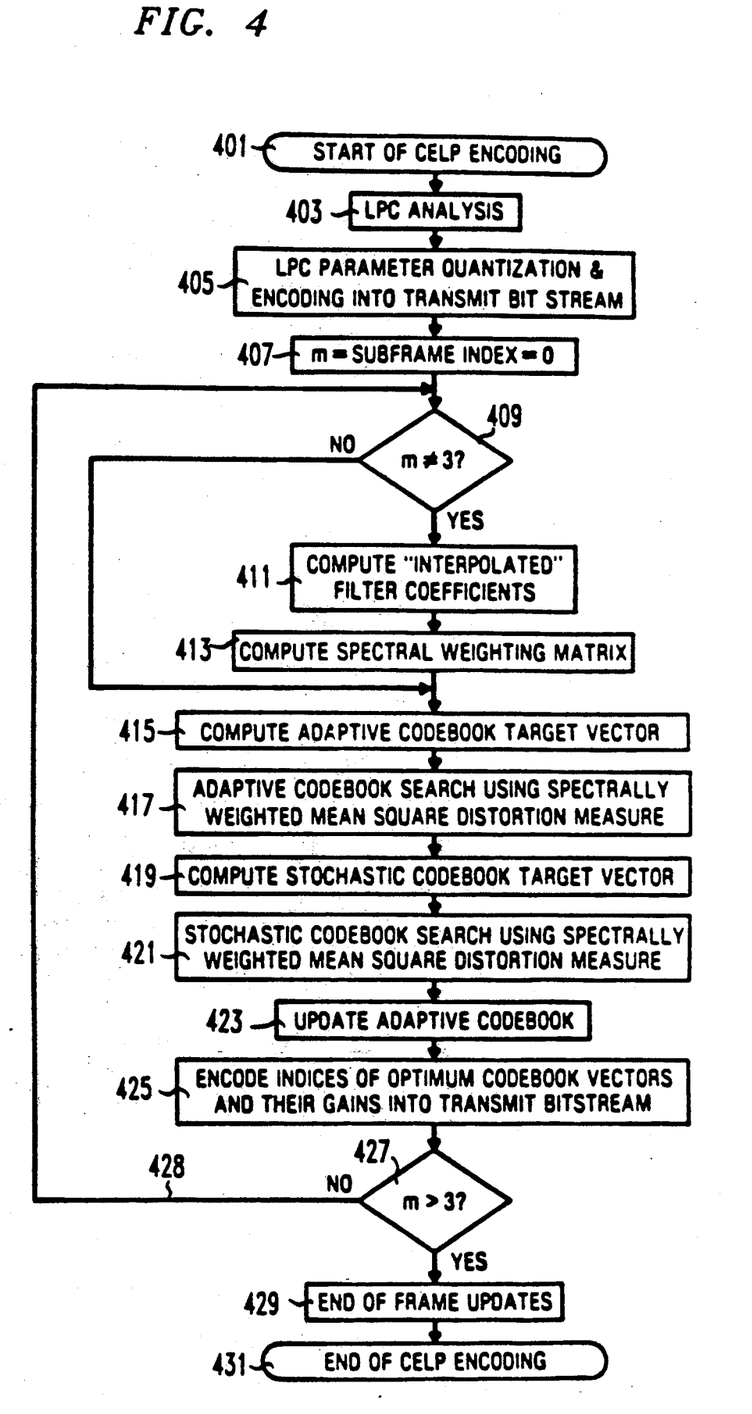
FIG. 4 is a flow diagram describing the encoding of speech in the speech processing module of FIG. 1.

The overall encoding process performed by the apparatus of FIG. 2 is shown by the flow chart of FIG. 4. The process is entered at the terminal block 401 and proceeds to the block 403 to perform the LPC (linear prediction coding) analysis. Linear prediction coefficients are derived by this process for the present window of interest. In terms of the apparatus of FIG. 2 the coded speech is provided at the output of the linear prediction filter 220 on lead 204 which provides a bit stream representative of the input speech applied to lead 201. The linear prediction filter 220 provides a digital signal from which all unnecessary redundancy has been removed from the coded speech signal to reduce the required transmission bandwidth. This process is implemented by the instructions of blocks 403 and 405. The process of block 405 quantizes and encodes the coefficients determined in the block 403.

The subframe index counter, which indicates the active subframe, is initially set to zero in block 407 and the flow process proceeds through decision block 409 which is operative to respond to the last subframe count equaling the number of subframes in one frame. As long as the count is less than the number of subframes in the frame the flow proceeds to the block 411 to compute the interpolated filter coefficients and to block 413 to compute the spectral weighting matrix. When the subframe count is reached, the flow of the process continues to the block 415 whose instructions are operative to compute the adaptive codebook target vector from the original speech input. The instructions of block 415 reflect the output of the frequency weighting filter 207 used to search the adaptive codebook 215 as shown in FIG. 2. The adaptive codebook is searched for the optimum adaptive codebook vector in the block 417 using spectrally weighted mean square distortion measures.

The target vector of the stochastic codebook is computed as per the instructions of block 419 and the stochastic codebook is searched as per the instructions of the block 421 to find a stored quantized vector entry closely matching the actual target vector of the input speech signal.

The adaptive codebook is updated according to the instructions of block 423 and the indices of optimum codebook vectors are encoded as per the instructions of the block 425. If all the sub frames have not been processed the process flow proceeds via lead 428 to the input of decision block 409. If all the subframes have been processed the flow continues to blocks 429 and 431 indicating the end of celp coding for the frame.

Figure 5:
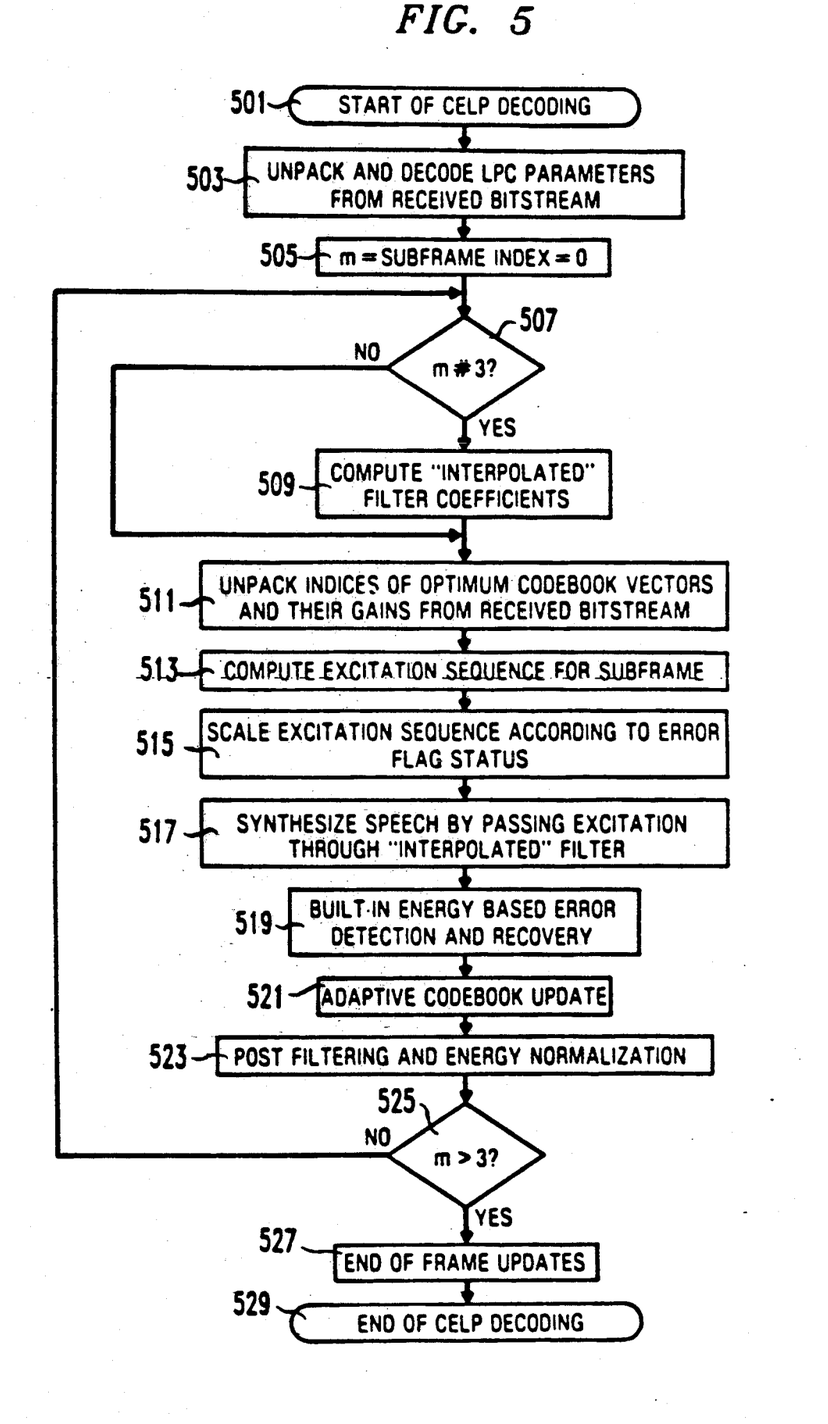
FIG. 5 is a flow diagram describing the decoding of speech that has been encoded by the process of FIG. 4.

The decoding process for recovering the original speech signal is disclosed in the flow chart of FIG. 5. This process is essentially the inverse of the processed FIG. 4 and is concerned with receiving speech from the received digital parameters.

The process is entered at the terminal 501 and the received LPC parameters are unpacked and decoded from the received bit stream as per the block 503. The subframe counter is set to zero as per the instructions of block 505 and the counter is read in decision block 507. As long as the counter is less than three the flow proceeds to the block 509 to compute interpolated filter coefficients. When the count equals three the flow proceeds directory to block 511 where the optimum codebook vectors are unpacked from the incoming bitstream.

The execution sequence for the subframe is computed in block 513 and scaled according to the instructions of block 515. Speech is synthesized in block 517 by passing the excitation signals through the interpolated filter. Error detection and recovery based on the signal energy is performed in the block 519 and the adaptive codebook is updated in block 521. The filtering to recover the transmitted speech signal is performed in the block 523. Decision block 525 determines if the last subframe has been processed and, if it has not been processed, the flow returns to the input of decision block 507. If the last frame is processed and the process updates the frames in block 527 and the CELP decoding is terminated in terminal block 529.

The subprocess for searching the stochastic codebook, shown as block 421 in FIG. 4, is a critical portion of the overall coding process. Hence, it is important that it be performed as expeditiously as possible. In many instances this codebook is a spare codebook, that is one in which a plurality of its entries are zeros. The search process, disclosed herein, is designed to accommodate an overlapping codebook in which adjacent vectors have many common entries, however, it is to be understood that the overlapping condition is not necessary to the process described. This condition is exploited according to the invention in order to speed up the search of the codebook. The overall process in performing this search is shown in the flow charts of the FIGS. 6 through 12.

This process of the flow charts considers that the stochastic codebook is a sparse fixed codebook of the size $C_S$ having the entries $\{C(i)\}$. The codebook includes the vectors of dimension N where:

$$C_0 = [C(0), C(1), \ldots C(N-1)]^T \qquad (1)$$
$$C_1 = [C(N), C(N+1), \ldots C(2N-1)]^T$$
$$\vdots$$
$$C_i = [C(iN), C(iN+1), \ldots C(iN+N-1)]^T$$
$$\vdots$$
$$C_{N_S-1} = [C((N_S-1)*N), C((N_S-1)*N+1), \ldots C(N_S*N-1)]^T$$

The value $N_S$ represents the number of codebook vectors and it is related to the codebook size $C_S$ by the expression:

$$C_S = N_S * N \qquad (2)$$

The codebook is sparse and hence most of the elements $C(i)$ have the value zero. In speech processing systems such as described herein the zero elements may comprise as many as 85% of the codebook entries. In searching the codebook a critical value is the $L_2$-norm distance measured between a target vector t and any codebook vector $C_i$. This measure is defined by the value:

$$\sigma_i = (t - \mu_i C_i)^T W(t - \mu_i C_i) \qquad (3)$$

The value $\underline{W}$ is a symmetric positive definite error weighting matrix; the value $\mu_i$ is the gain associated with i-th vector. The optimum value of the gain for the vector $C_i$ is defined by the expression:

$$\mu_i = \frac{t^T \underline{W} C_i}{C_i^T \underline{W} C_i} \qquad (4)$$

The above equation gives the actual gain values. If the values of gain are included in a quantized table the gain value closest to an actual gain is used. The optimum value for the gain is determined by the ratio of the correlation term to the energy term of matrix. Correlation and energy terms are well known in the art and it is not believed necessary to discuss them in detail. The value $\mu_i$ is equal to:

$$\mu_i = \rho_i / e_i$$

where: $\rho_i = t^T \underline{W} C_i$, and $\qquad (5)$ $$e_i = C_i^T \underline{W} C_i$$

Given a value for $M_i$, the optimum index $i_{opt}$ is that value which minimizes the distortion measure $\overline{\sigma}_i$. The expressions for finding $\overline{\sigma}_i$ may be expanded and the non-critical term that does not depend on the index i eliminated. The resulting expression of interest is the distortion measure $\sigma_i$ where $$\sigma_i = v_i^2 e_i - 2\mu_i \sigma_i$$

The correlation term $\rho_i$ can be computed by storing the spectral weighting matrix where:

$$Y = [y(0), y(1), \ldots y(N-1)]^T = \underline{W} t \qquad (6)$$

and then applying the formula:

$$C_i^T Y = \rho_i = \sum_{k=0}^{N-1} C(iN + k) * y(k) \qquad (7)$$

The energy term is computed by the formula:

$$C_i^T \underline{W} C_i = e_i = \sum_{l,k=0}^{N-1} c(iN + 1) W(l,k) C(iN + k) \qquad (8)$$

where W(1,k) is the (1,k)th entry of the matrix $\underline{W}$.

There are two sets of information defining the sparse nature of the codebook that are used to improve the efficiency of computation of these correlation and energy terms. The first piece of information is the number of non zero elements (#NZE) in each vector $C_i$. These elements are designated as $N_i$ and defined as the number of non-zero elements in the i-th codebook vector, i.e., $$N_i = \#NZE\{C(iN), C(iN+1), \ldots C(iN+N-1)\}. \qquad (9)$$

The second piece of information is the offsets of the non-zero elements. This information is provided for the i-th codebook vector $C_i$ only if $N_i \neq 0$. The successive offsets of the non-zero elements of this vector all start from a suitable reference point. Thus if $C(iN+1_1)$, $C(iN+1_2), \ldots C(iN+1_{N_i})$ represents the non-zero elements of $C_i$, then the successive offsets starting from $C(iN)$ are given by the terms:

$$M_i(1) = l_1 \qquad (10)$$
$$M_i(2) = l_2 - l_1$$
$$\vdots$$
$$M_i(N_i) = l_{N_i} - l_{N_i-1}$$

This information is stored for each vector $C_i$. With the above information concerning the sparseness of the codebook the necessary energy and correlation terms may now be readily computed with a great reduction in the complexity of computations.

For the correlation term:

$$\rho_i = 0; \text{ when } N_i = 0 \qquad (11)$$

$$\rho = \sum_{k=1}^{N_i} C(iN + l_k) y(l_k); \text{ when } N_i \neq 0 \qquad (12)$$

-continued where:

$$l_k = \sum_{p=1}^{k} M(p); \text{ where } 1 \leq k \leq N_i$$

For the energy term:

$$e_i = 0; \text{ when } N_i = 0 \quad (13)$$

$$e_i = \sum_{k,j=1}^{N_i} C(iN + 1_k) W(l_k, l_j) C(iN + 1_j); \text{ when } N_i \neq 0 \quad (14)$$

and where $1_k$ and $1_j$ are as defined by equation (12).

The above procedure produces a significant reduction in the multiply-add count at register level operation from O(N) to O($N_i$) in the case of the correlation term and from O($N^2$) to O($N_i^2$) in the case of the energy term. If greater then two-thirds of the code book entries are zero, a significant reduction in computation complexity is achieved.

Further improvements in computation can be obtained if the codebook entries are in addition overlapping and if the error weighting matrix $\underline{W}$ is Toeplitz matrix. An overlapping code book is one in which adjacent share common elements. These features are likely to occur in codebooks for low bit rate CELP codes. The auxiliary information can be further modified to facilitate efficient computation by exploiting the overlapping nature of the codebook and Toeplitz error weighting matrix $\underline{W}$.

In the case of an overlapping sparse codebook of size $C_8$ with the entries $\{C(i)\}$, where $0 \leq i \leq C_S - 1$; and where N is the vector dimension and d is the degree of overlap; the codebook vectors are given by the expression:

$$\begin{aligned} C_0 &= [C(0), C(1), \ldots C(N-1)]^T \\ C_1 &= [C(d), C(d+1), \ldots C(N+d-1)]^T \\ &\vdots \\ C_i &= [C(id), C(id+1), \ldots C(N+id-1)]^T \\ &\vdots \\ C_{N_S-1} &= [C((N_S-1)d), C((N_S-1)d+1), \ldots \\ & \quad C((N_S-1)d+N-1)]^T \end{aligned} \quad (15)$$

here $N_S$ is the number of codebook vectors and is related to the codebook size by the relation:

$$C_S = (N_S - 1) \cdot d + N \quad (16)$$

As in the general case described above the optimum index term is that term that minimizes the distortion measure $\sigma_i$ which is a combination of the energy and correlation terms. The expression is:

$$\sigma_i = \mu_i^2 e_i - 2\mu_i \rho_i \quad (17)$$

$e_i$ is the energy term $C_i^T \underline{W} C_i$ and $\rho_i$ is the correlation term $C_i^T \underline{W} t$.

$$\underline{W} = [W(i,j)]_{N \times N} = [W(i-j,0)]_{N \times N} \quad (18)$$

The matrix $\underline{W}$ is a Toeplitz matrix. For this special case the correlation term is computed by storing the values $\underline{Y} = \underline{W} t$ and using the equation:

$$\rho_i = \sum_{k=0}^{N-1} C(id + k) y(k) \quad (19)$$

to computer for the correlation term.

The energy term is calculated exploiting the sparseness of the codebook and the Toeplitz nature of the matrix $\underline{W}$. The following recursive relations are derived for the first codebook vector for i=0:

$$e_i = W(0,0) R_c(0) + 2 \sum_{j=1}^{N-1} W(j,0) R_c(j) \quad (20)$$

where $$R_c(j) = \sum_{k=0}^{N-1-j} C(k) C(k+j), \ldots 0 \leq j \leq N-1 \quad (21)$$

This expression is precomputed and stored. For $1 \leq i \leq N_S - 1$ we have the expressions;

$$e_i = e_{i-1} + \sum_{k=(i-1)d}^{id-1} [2(\Delta_{k,1} - \Delta_{k,2}) + (\Delta_{k,4} - \Delta_{k,3})] \quad (22)$$

where:

$$\Delta_{k,1} = C(k+N) \sum_{j=1}^{N-1} W(j,0) C(k+N-j) \quad (23)$$

$$\Delta_{k,2} = C(k) \sum_{j=1}^{N-1} W(j,0) C(k+j) \quad (24)$$

$$\Delta_{k,3} = C(k) W(0,0) C(k) \quad (25)$$

$$\Delta_{k,4} = C(k+N) W(0,0) C(k+N) \quad (26)$$

The auxiliary information is modified by these partial sums and the correlation term. In the case of the first partial sum $\Delta_{k,1}$ the number $Ne_{k,1}$ of non-trivial multiply-adds is given by the expressions;

$N_{k,1} = 0$; when $C(k+N) = 0$ and $N_{k,1} = \#NZE\{C(k+N-1), \ldots C(k+1)\}$; when
$C(k+N) \neq 0$ \quad (27)

In the case of the second partial sum $\Delta_{k,2}$, the number of non-trivial multiply-adds $N_{k,2}$ is given by the expression:

$N_{k,2} = 0$; when $C(k) = 0$ and \quad (28)

$N_{k2} = \#NZE\{C(k+1), \ldots C(k+N-1)\}$; when
$C(k) \neq 0$

For the case of the correlation term $\rho_i$ the number of non-trival multiply-adds $N_i$ is given by the expression:

$$N_i = \#NZE\{C(id), C(id+1), \ldots C(id+N-1)\}; \quad (29)$$

The second set of auxiliary information consists of successive offsets of each non-zero element of the codebook used in these sums starting from a suitable reference point. Thus if $Ne_{k,1} \neq 0$ and the elements $$C(k+N-1_1), C(k+N-1_2), \ldots C(k+N-1_{N_{k,l}}) \quad (30)$$

are non-zero, then the successive offsets from the reference point $C(k+N)$ are given by the expressions:

$$M_{k,1}(1) = l_1 \quad (31)$$
$$M_{k,1}(2) = l_2 - l_1$$
$$\vdots$$
$$M_{k,1}(N_{k,1}) = l_{N_{k,1}} - l_{N_{k,1}-1}$$

Similarly, if $N_{k,2} \neq 0$ and the elements $C(k+r_1)$, $C(k+r_2)$, ... $C(k+r_{N_{k,2}})$ are non-zero then the successive offsets from $C(k)$ are given by the expressions:

$$M_{k,2}(1) = r_1 \quad (32)$$
$$M_{k,2}(2) = r_2 - l_1$$
$$\vdots$$
$$M_{k,2}(N_{k,2}) = r_{N_{k,2}} - r_{N_{k,2}-1}$$

finally if $N_i = 0$ and the elements $C(id+S_1)$, $C(id+S_2)$, ... $C(id+S_{N_i})$ are non-zero then the successive offsets from $C(id)$ are given by $$M_i(1) = S_1 \quad (33)$$
$$M_i(2) = S_2 - S_1$$
$$\vdots$$
$$M_i(N_i) = S_{N_i} - S_{N_i-1}$$

The prestored auxiliary information is used to calculate $\Delta_{k,1}$ using the equations:

$$\Delta_{k,1} = 0; \text{ if } N_{k,1} = 0 \quad (34)$$

$$\Delta_{k,1} = C(k+N) \sum_{j=0}^{N_{k,1}} W(l_j,0)C(k+N-l_j) \text{ if } N_{k,1} \neq 0 \quad (35)$$

Where:

$$l_j = \sum_{P=1}^{j} M_{k,1}(P) \text{ for } 1 \leq j \leq N_{k,1} \quad (36)$$

The value for $\Delta_{k,2}$ may be calculated as follows:

$$\Delta_{k,2} = 0; \text{ if } N_{k,2} = 0 \quad (37)$$

$$\Delta_{k,2} = C(k) \sum_{j=0}^{N_{k,2}} W(r_j,0), C(k+r_j) \text{ if } N_{k,2} \neq 0 \quad (38)$$

where:

$$r_j = \sum_{P=1}^{j} M_{k,2}(P), 1 \leq j \leq N_{k,2} \quad (39)$$

The value of $\rho_i$ is calculated by the expression $$\rho_i = 0; \text{ if } N_i = 0 \quad (40)$$

$$\rho_i = \sum_{j=1}^{N_i} C(id+S_j)y(S_j) \text{ if } N_i \neq 0 \quad (41)$$

where:

$$S_j = \sum_{P=1}^{j} M_i(P); 1 \leq j \leq N_i \quad (42)$$

The auxiliary information developed operates to significantly reduce the computations involved in the codebook search. In this method the sparseness of the codebook is exploited to the maximum extent in addition to exploiting the overlapping nature of the codebook and Toeplitz matrix nature of the error weighting matrix $\underline{W}$.

Figure 9:
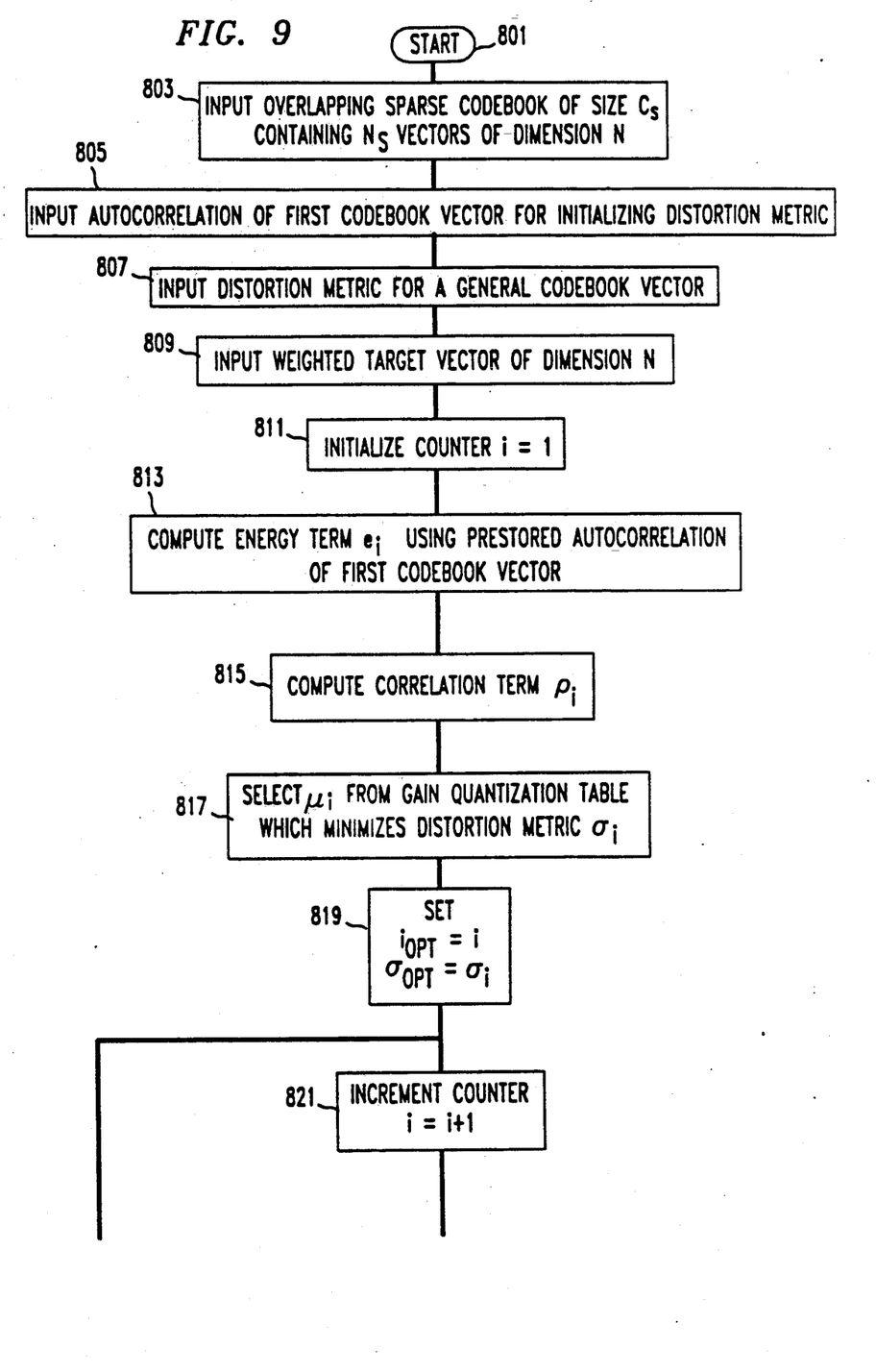
Figure 10:
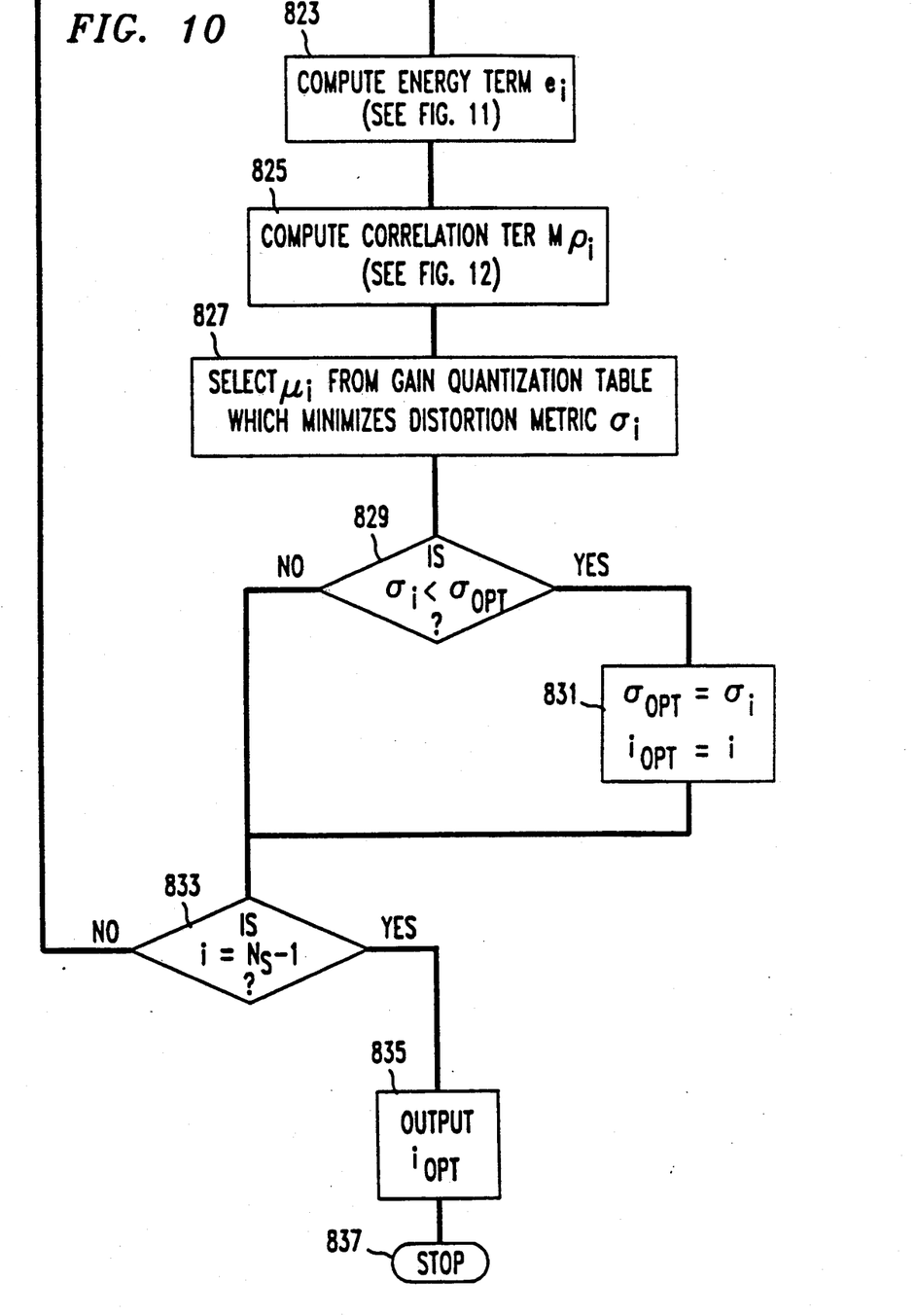
Figure 11:
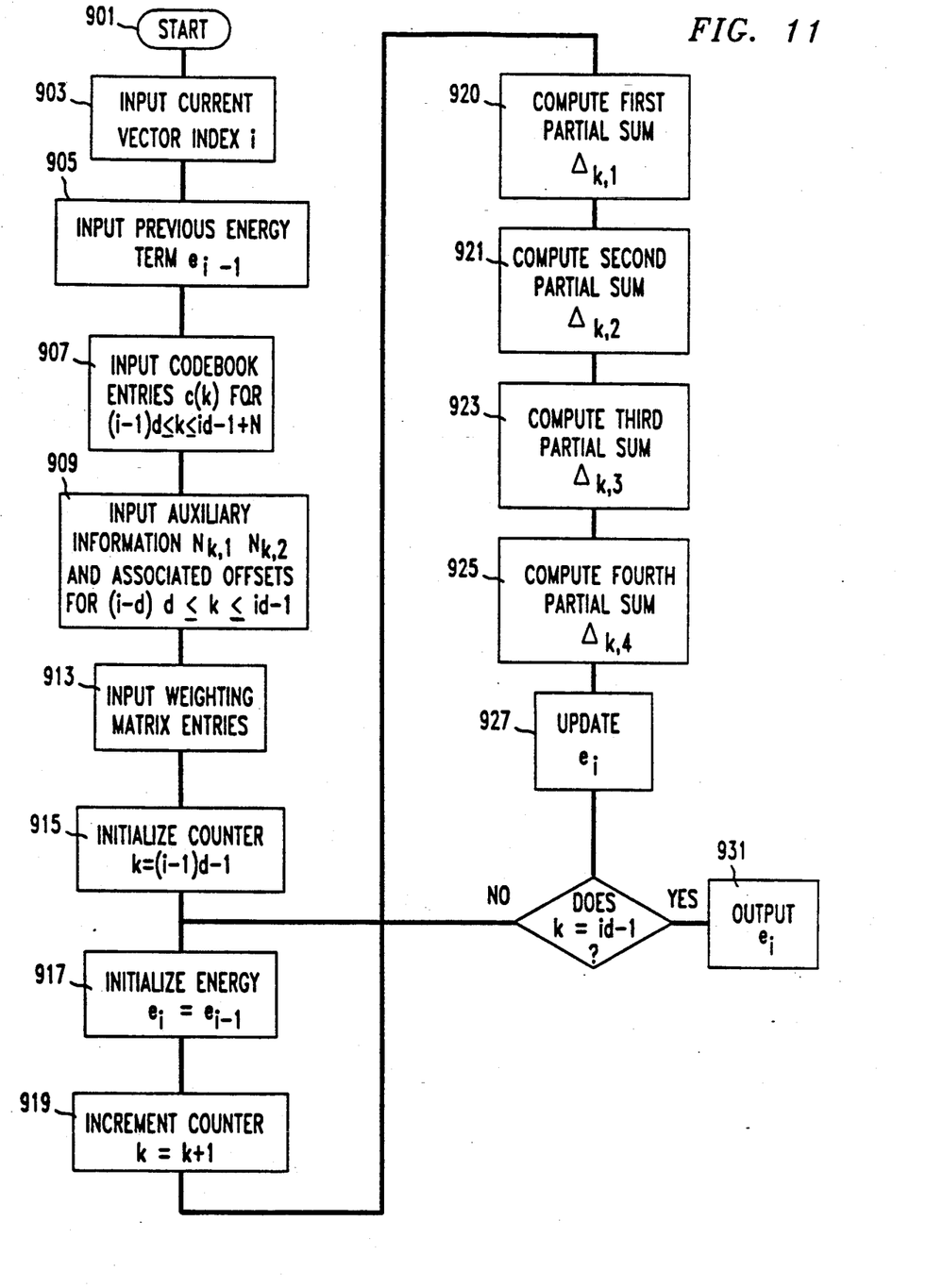
Figure 12:
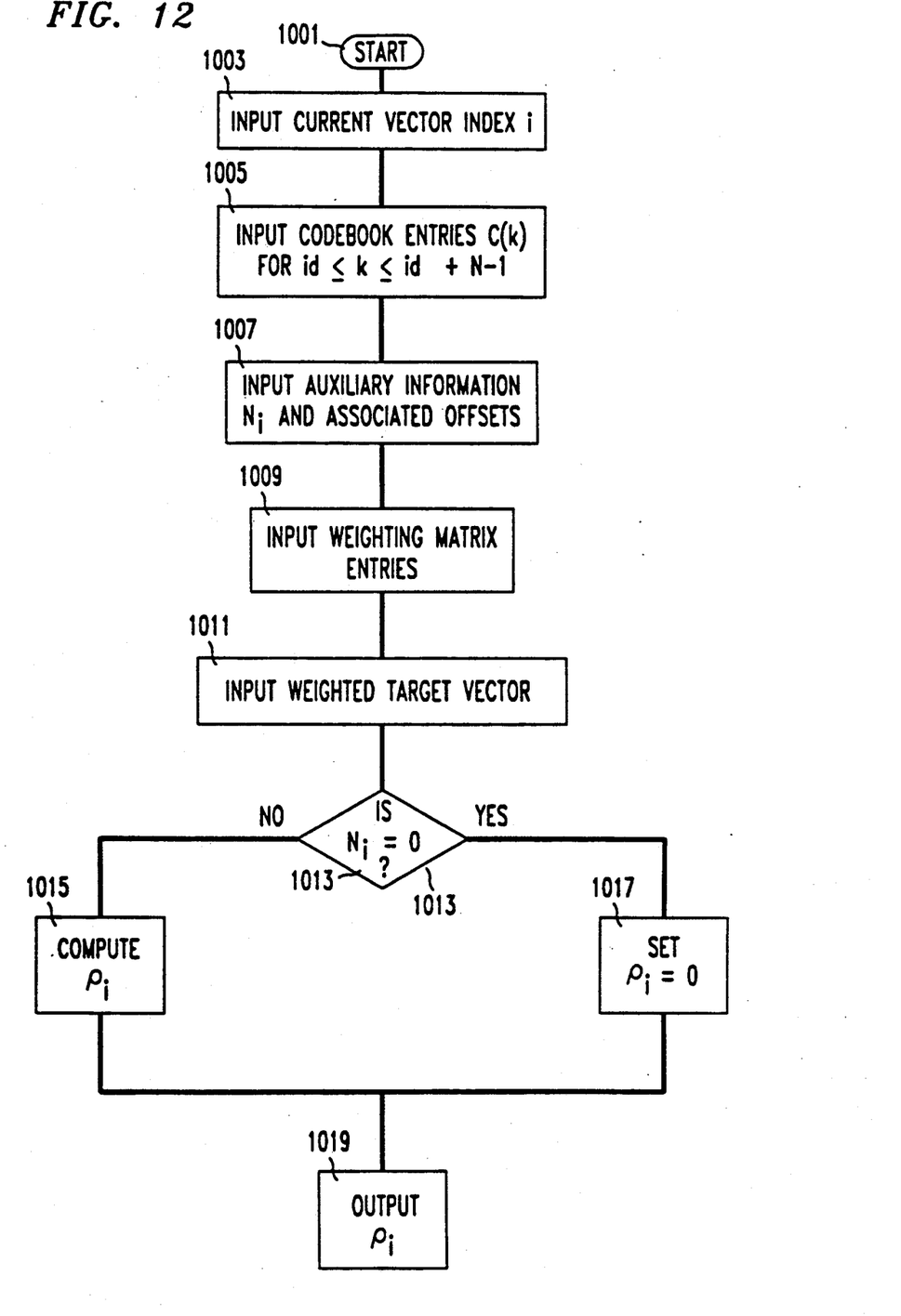
Figure 13:
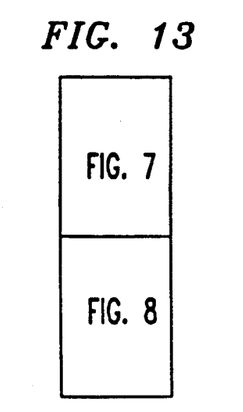

The process for developing and utilizing the auxiliary information is disclosed in the flow processes in FIGS. 6–12. The processes of FIGS. 6, 7 and 8 operate to generate the auxiliary information. The process of FIGS. 9 and 10 utilize the auxiliary information in reaching the codebook. The process of FIGS. 11 and 12 are subprocesses used in the process of FIGS. 9 and 10.

Figure 6:
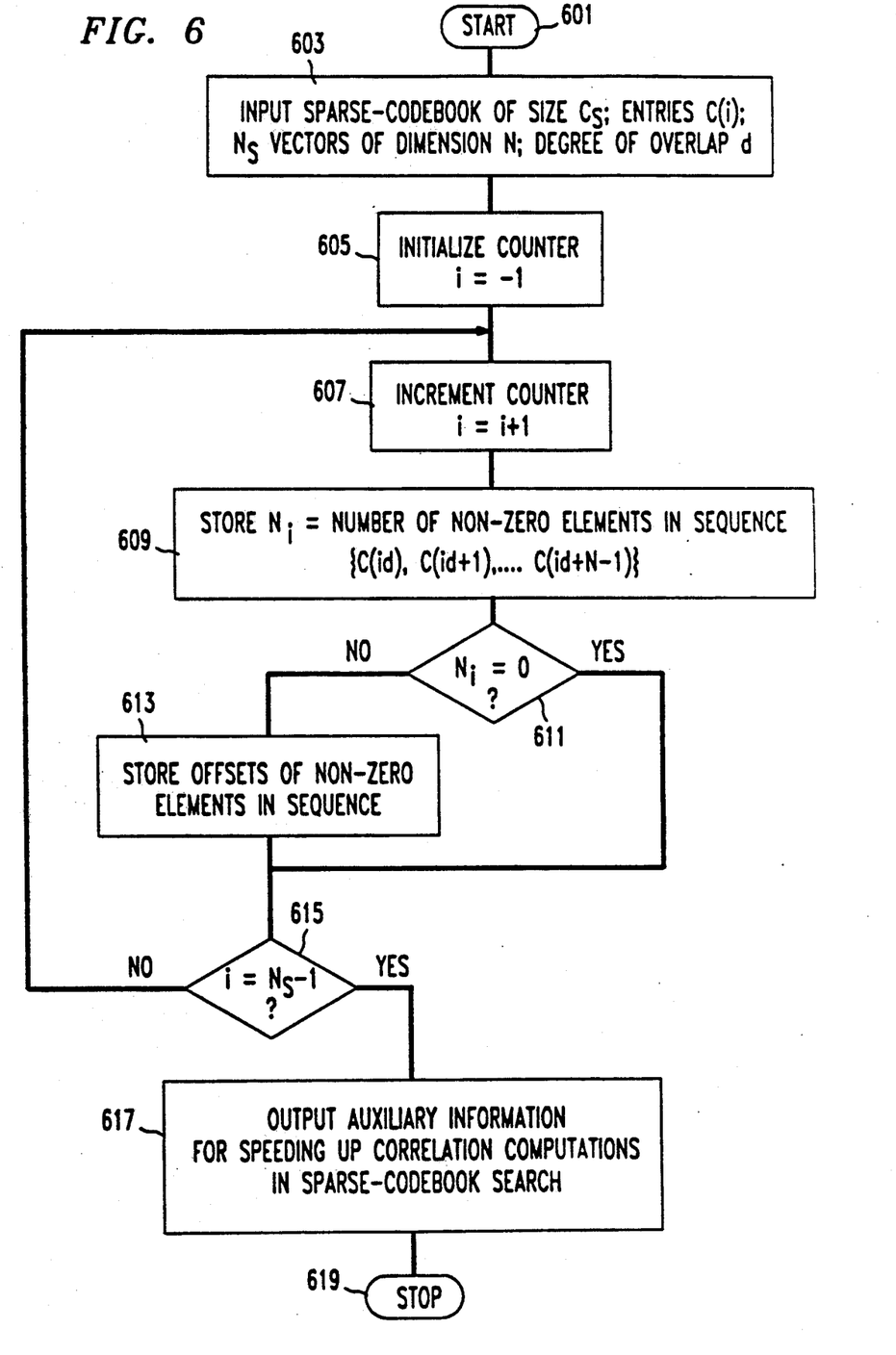
FIGS. 6-14 are flow diagrams describing a search of a stochastic codebook occurring in the process of FIG. 4.

The process of FIG. 6 is operative to generate auxiliary information defining the overlapping nature of the sparse codebook. The process starts at the input terminal 601 in FIG. 6. The codebook is defined as having a size $C_s$ and its individual entries $C(i)$ are entered into the process. The codebook contains $N_S$ vectors of the dimension N. The entries of the vectors are specified as having an overlap to the degree d.

With the codebook entered in the process a counter is initialized to the value $i = -1$ in the block 605. This counter value is incremented by 1 according to the expression $i = i+1$ in the next block 607. The number of non-zero elements $N_i$ in the i-th codebook vector are stored in the memory serving the process as per block 609. Its value is given by equation (29). The entries of the i-th codebook vector take the symbolic form:

$$\{C(id), C(id+1), \ldots C(id+N-1)\}$$

The process of decision block 611 determines if the value of $N_i$ is zero. If the answer is no, the offset positions of the non-zero elements are determined in the form of equation (33) and recorded and stored per the instructions of block 613. The process of decision block 615 determines if the index i equals $N_s - 1$. If the answer is no, the process to block 607. Otherwise the process proceeds to block 617 and outputs the auxiliary information concerning partial sums for speeding up the correlation computations.

Figure 7:
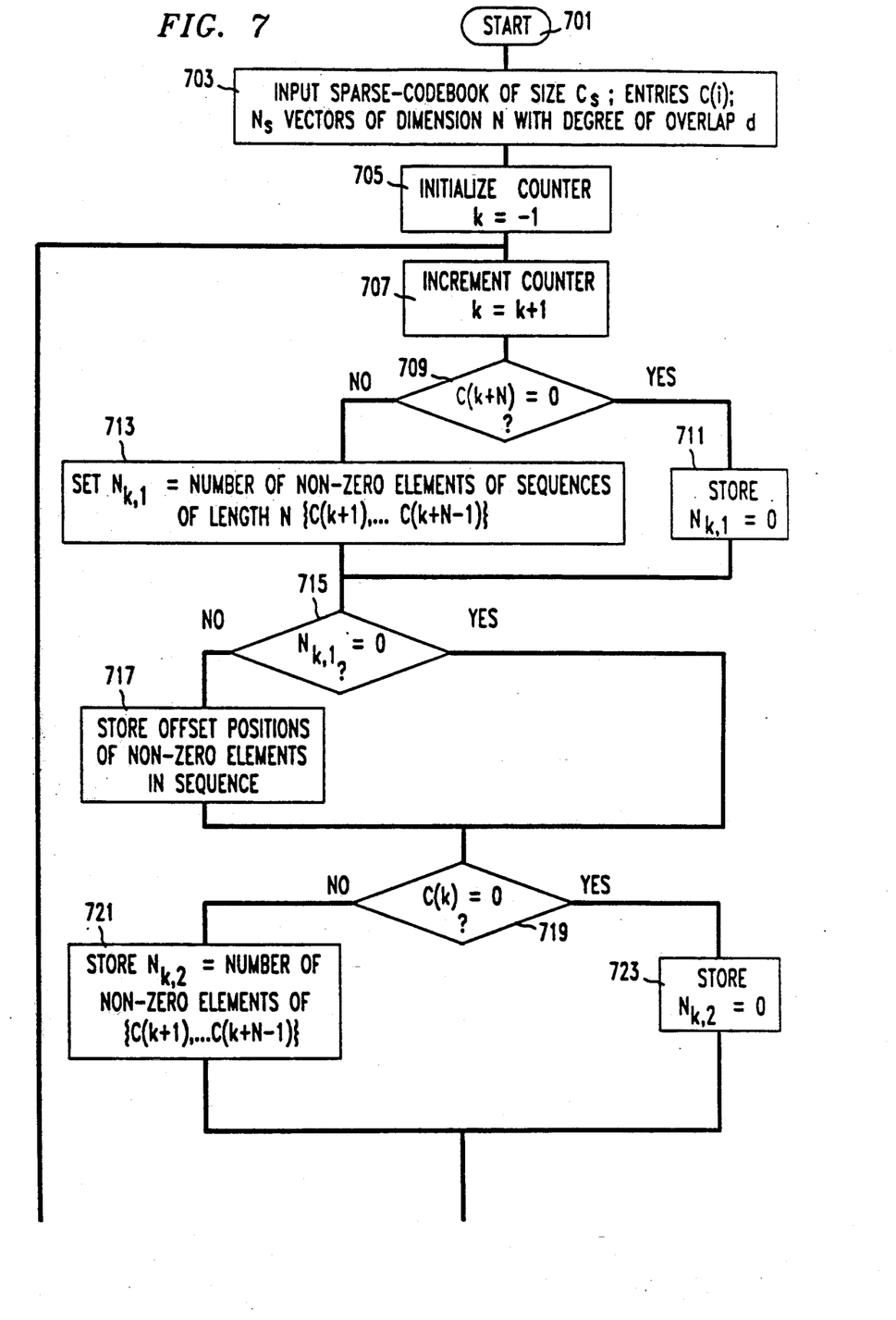

The process of FIG. 7 to determine the auxiliary information for speeding up calculation of the energy term and of the correlation term is begun in the start terminal 701. The sparse codebook of size $C_s$ is entered into the process by the instructions of block 703. The counter of block 705 is initialized to the value $-1$ and immediately incremented in the block 707. It is determined in decision block 709 if the value $C(k+N) = 0$. If the value is yes, the element $N_{k+1}$ is set equal to zero. If the value is no, the element $N_{k,1}$ is set equal to the number of non-zero elements in the sequence of length $\{C(k+1), \ldots C(k+N-1)\}$ in the block 713. These values are determined according to the equation (27).

The flow process proceeds to the decision block 715 to determine if the element $N_{k+1}$ is equal to zero. If it is, flow proceeds to decision block 719. If it is not, the flow proceeds to the function block 717 to store the offset positions as shown by equation (31) of the non-zero elements.

The next decision block 719 determines if the value $C(k)$ is equal to zero. If it does, the value $N_{k,2}$ is set to zero in block 723. If it is not, the value of $N_{k,2}$ is set to the number of non-zero elements as indicated by the equation (28) in the block 721.

The flow of process proceeds to the decision block 725 to determine if the value of $N_{k,2}$ is equal to zero. If it is not, the flow proceeds to block 727 wherein the offset positions of the non-zero elements as given by equation (32) are stored. The flow continues to the decision block 729 to evaluate the expression $k=(N_s-1)d-1$. If the expression is not valid, the flow returns to the input to block 707 and the process is repeated. If the expression is valid, the flow proceeds to the block 731 to store the developed auxiliary information to be used in the search of the sparse codebook.

Figure 14:
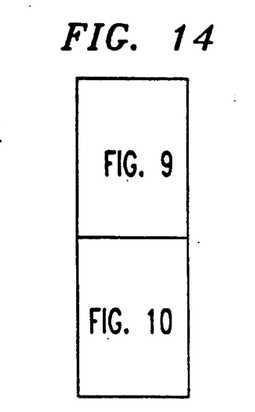

The process of FIGS. 9 and 10 (connected as shown in FIG. 14) is operative for using the generated auxiliary information for searching the codebook. The flow process is entered at the start terminal 801 and proceeds to the function block 803 which inputs the overlapping sparse codebook of size $C_S$ containing $N_S$ vectors of dimension N. The flow proceeds to the block 805 to input the autocorrelation of the first codebook vector that initializes the first energy term. These values are given by equation (21). The distortion metric for a general codebook vector is determined per equation (17) in the block 807 and input to the process and the weighted target vector Y of dimension N is input in block 809.

The process counter for i is initialized to one in the block 811. The energy term $e_i$ is computed in the block 813 as per equation (20) using the previously determined prestored autocorrelation term of the first codebook vector. The correlation term $\rho_i$ is computed by equation (19) in the block 815. The value of the gain $\mu_i$ which minimizes the distortion metric $\sigma_i$ is selected from a predetermined table of quantized gain values in the block 817. The minimum distortion metric $\sigma_{opt}$ is initialized to the value $\sigma_i$ and the optimum index value $i_{opt}$ is initialized in i in the block 819.

The process counter is incremented in the block 821 by one. The energy term is computed using equation (22) in the block 823 and by using the process detailed in the flow chart of FIG. 11. The correlation term is computed using equation (19) in the block 823 and by using the process detailed in the flow chart of FIG. 12.

A gain value $\sigma_i$, which minimizes the distortion metric $\sigma_i$, is selected from the quantization table per the instructions of the block 827. The decision block 829 determines if the computed distortion metric $\sigma_i$ is the minimum value. If it is, the values of $\sigma_{opt}$ and its index number $i_{opt}$ are set to $\sigma_i$ and i in block 831 and the process flow proceeds to the decision block 833. If the distortion metric $\sigma_i$ is not minimum, the flow proceeds directly to the decision block 833.

Decision block 833 determines if the value for the index number i is equal to the term $N_S-1$. If the quality holds the process proceeds to the block 835 to output the optimum index term $i_{opt}$ and the process stops at terminal block 837. If the value for i does not equal $N_S-1$ the flow returns to the input to the block 821 where the counter is incremented and the process continues.

Figure 8:
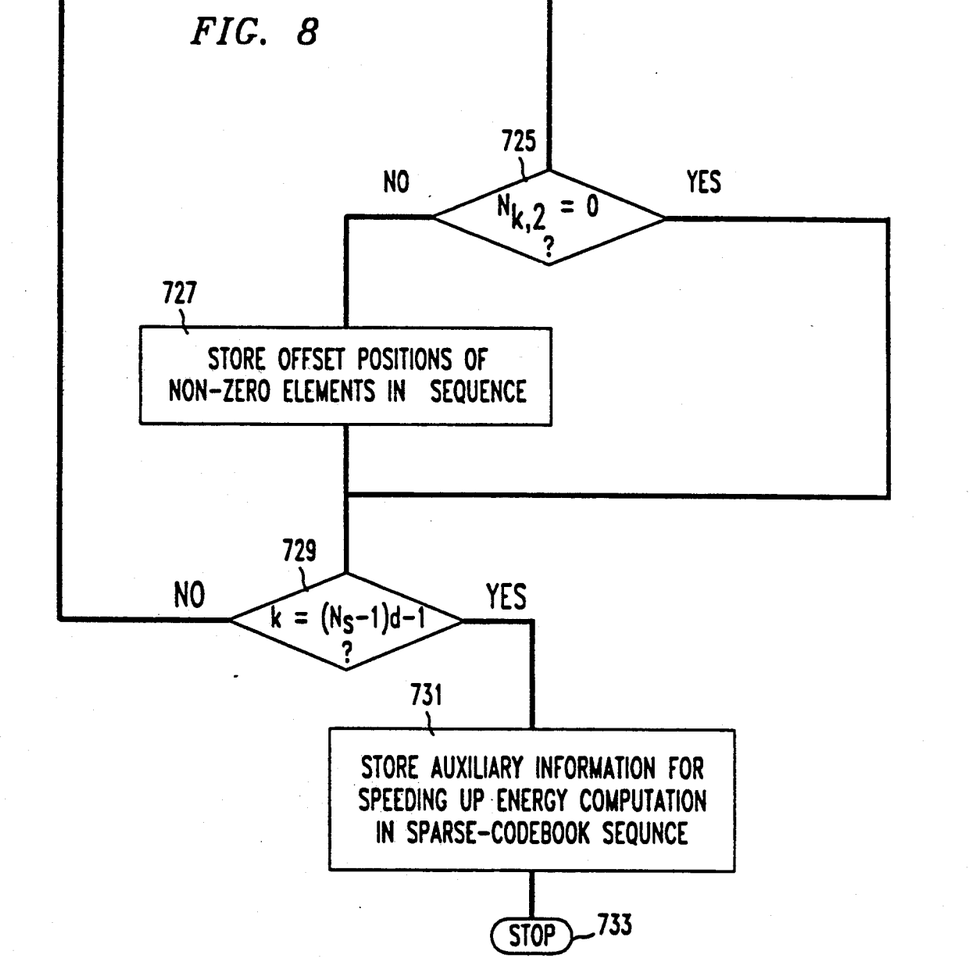

The process for computing the energy term $e_i$ is disclosed in the FIG. 11 and starts in the start terminal 901. The first step is to input the current vector index in the block 903. The previous energy term $e_{i-1}$ is entered in the block 905 and the codebook entries C(k) are entered in the block 907 for the values $(i-1)d \leq k \leq id-1+N$. The auxiliary information including $N_{k,1} N_{k,2}$ and associated offsets, developed in the flow processes of FIGS. 6, 7 and 8, are input in the block 909. The weighted matrix entries are entered in the block 915.

The counter for the value k is initialized to the value $k=(i-1)d-1$ in the block 915 and the energy term $e_i$ is initialized to the value $e_{i-1}$ in the block 917. The counter for k is incremented in the block 919 and the first partial sum $\Delta_{k,1}$ is computed in the block 920 using equations (34), (35) and (36). The second partial sum $\Delta_{k,2}$ is computed in the block 921, using equations (37) (38), and (39), the third partial sum $\Delta_{k,3}$ is computed in the block 923 using equation (25) and the fourth partial sum $\Delta_{k,4}$ is computed using equation (26) in the block 925. The value for $e_i$ is updated in the block 927 and the value of k is evaluated in the decision block 929. If the value for k is id-1 the value of $e_i$ is output in the block 931. If the value for k is not id-1 the flow returns to the input to the block 917 and the process is repeated.

The process for determining the correlation term $\rho_i$ is disclosed in the flow chart of the FIG. 12. Beginning at start terminal 1001 the first step is the inputting of the codebook entries, inputing of the current vector index i and the C(k) in the block 1005 for $id \leq k \leq id+N-1$. The auxiliary information $N_i$ and offsets developed in the flow charts of FIGS. 6, 7 and 8 are input in the block 1007. The weighting matrix entries are input in the block 1009 and the weighted target vector is input in block 1011.

Decision block 1013 determines if the value of $N_i$ is equal to zero. If it is the value of $\rho_i$, it is set to zero in the block 1017. If it is not the value of $\rho_i$, it is computed using equations (40), (41) and (42) in the block 1015. The value of $\rho_i$ is output in the block 1019.

I claim:

1. Speech processing circuitry for a radio transmission system, comprising:
   an input to accept analog speech;
   an analog to digital signal converter for converting the analog speech to digital signals;
   speech encoder circuitry for encoding the digital speech signals; including circuitry to encode the digital speech signal as a target vector quantity;
   a sparse codebook with a plurality of codebook vectors stored therein;
   wherein the improvement comprises:
   search means for selecting a vector from the sparse codebook that most nearly approximates the target vector quantity of the digital speech signal, comprising;
   means for generating correlation and energy terms for facilitating searching the codebook for a vector approximating the target vector;
   means for facilitating computation of the correlation and energy terms by computing auxiliary information, defining a sparse nature of the sparse codebook, including;
   means for determining the number of non-zero elements in each codebook vector;
   means for determining the successive offsets of the non-zero elements of the codebook vector;
   means for computing the correlation term and the energy term from the auxiliary information; and
   radio transmission circuitry for transmitting the encoded digital speech signal.

2. Speech processing circuitry for a radio transmission system as claimed in claim 1,
   wherein the improvement further comprises:
   means for determining a degree of overlapping of vectors in the codebook;
   means for utilizing the degree of overlapping for computation of the energy and correlation terms.

3. Speech processing circuitry for a radio transmission system as claimed in claim 2,
   wherein the improvement further comprises:

means for determining a gain value for each individual vector; and means for determining the optimum gain value.

4. Speech processing circuitry for a radio transmission system as claimed in claim 3, wherein the improvement further comprises:

means for determining a distortion metric, and means for using the distortion metric for selecting a gain value.

5. A method for encoding speech signals for radio transmission comprising the steps of:

converting analog speech into a digital speech signal;

encoding the digital speech signals for radio transmission by the steps of:

converting the speech signal into a target vector quantity;

storing a plurality of random vectors into a codebook having a spare nature in that at least a majority of the entries have a zero value;

searching the codebook for selecting one of the random vectors which most nearly matches the target vector;

the step of searching including the steps of:

generating auxiliary information to facilitate codebook searching by:

determining the number of non-zero elements in each codebook vector, and determining the successive offsets of the non-zero elements of each codebook vector;

computing correlation and energy terms of the codebook matrix from the auxiliary information;

searching the codebook for the random vector which most nearly matches the target vector by utilizing the correlation and energy terms to determine a distance between the codebook vectors and the target vector;

selecting the vector closest to the target vector to encode the digital speech signal;

transmitting the encoded speech signal by radio signals.

6. A method for encoding speech signals for radio transmission as claimed in claim 5, further comprising the steps of:

determining a degree of overlapping of vectors in the codebook;

utilizing the degree of overlapping for further enhancing computation of the energy and correlation terms.

7. A method for encoding speech signals for radio transmission as claimed in claim 6;

further comprising the steps of:

determining a gain value for each individual vector, and determining the optimum gain value.

8. A method for encoding speech signals for radio transmission as claimed in claim 6;

further comprising the steps of:

determining a distortion metric, and using the distortion metric for selecting a gain value.

9. A method for processing speech in a radio telecommunication system, comprising:

encoding a digital speech signal by the steps of:

converting the digital speech signal into a target vector quantity;

storing a plurality of random codebook vectors into a stored codebook having a sparse content of entities such that at least a majority of the elements entities have a zero value;

searching the codebook to select a random codebook vector that most closely matches the target vector;

the steps of searching comprising:

determining and storing the number of non-zero elements in each codebook vector;

determining and storing the successive offsets of the non-zero elements for each codebook vector as a starting reference point;

associating an index number with each random codebook vector;

defining an error weighting matrix;

computing a correlation term between the codebook vectors and the target vector by summing the products of the non-zero elements of the codebook vectors and the corresponding elements of the target vectors using stored successive offsets;

computing an energy term for the codebook vectors by summing only determined non-zero elements;

determining gain values associated with each random codebook vector as a ratio of the correlation term to the energy term;

determining a distance value between the target vector and the random vectors of the codebook as a difference between the gain modified correlation terms and gain modified energy terms of the codebook vectors;

determining the optimum index number associated with a distance value to minimize the distance value between the codebook vector and the target vector, and transmitting the index number by radio signals.

10. A method for processing speech in a radio telecommunication system, as claimed in claim 9;

further including the steps of:

determining a degree of overlapping of codebook vectors;

deriving and storing recursive relations from the overlapping of codebook vector entities, and determining the energy terms by further utilizing partial sums of the recursive relations.

11. A method for processing speech in a radio telecommunication system, as claimed in claim 10;

further including the steps of:

determining the correlation terms by further utilizing partial sums of the recursive relations.

12. A method for processing speech in a radio telecommunication system, as claimed in claim 11;

further including the steps of:

determining the partial sums of the recursive relations by multiplying each of the codebook entries by the corresponding error weighting matrix entry.

13. A method for processing speech in a radio telecommunication system, as claimed in claim 11;

wherein the step of determining the gain value includes the step of:

comparing a gain value, determined as a ratio of the correlation term to the energy term, with a stored plurality of gain values and selecting the stored gain value closest to the value of the ratio.

* * * * *